United States Patent
Cha et al.

(10) Patent No.: US 10,802,912 B2
(45) Date of Patent: Oct. 13, 2020

(54) SEMICONDUCTOR MEMORY DEVICE AND MEMORY SYSTEM HAVING THE SAME

(71) Applicant: Samsung Electronics Co., Ltd., Suwon-si (KR)

(72) Inventors: Sang Uhn Cha, Suwon-si (KR); Hyun Gi Kim, Anyang-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 11 days.

(21) Appl. No.: 16/377,183

(22) Filed: Apr. 6, 2019

(65) Prior Publication Data

US 2020/0159617 A1    May 21, 2020

(30) Foreign Application Priority Data

Nov. 19, 2018   (KR) .................. 10-2018-0142547

(51) Int. Cl.
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 3,755,779 A | 8/1973 | Price | |
| 7,325,183 B2 | 1/2008 | Deolalikar | |
| 7,721,178 B2 | 5/2010 | Dell et al. | |
| 8,250,445 B2 | 8/2012 | Truong et al. | |
| 8,352,847 B2 | 1/2013 | Gunnam | |
| 8,510,641 B2 | 8/2013 | Jones, Jr. | |
| 9,235,466 B2 * | 1/2016 | Sohn ................ | G06F 11/10 |
| 9,727,412 B2 | 8/2017 | Son et al. | |
| 9,786,387 B2 * | 10/2017 | Cha .................. | G11C 29/52 |
| 9,811,420 B2 | 11/2017 | Das et al. | |
| 10,127,102 B2 * | 11/2018 | Ryu ................. | G06F 11/1048 |
| 10,635,531 B2 * | 4/2020 | Cha .................. | G11C 29/52 |

FOREIGN PATENT DOCUMENTS

KR   2016-0023151 A   3/2016

* cited by examiner

*Primary Examiner* — Phung M Chung
(74) *Attorney, Agent, or Firm* — Muir Patent Law, PLLC (57) ABSTRACT

Disclosed are a semiconductor memory device and a memory system including the same. The semiconductor memory device includes a memory cell array having a plurality of memory cells and includes an error correcting code (ECC) decoder configured to receive first data and a first parity for the first data from selected memory cells of the memory cell array, generate a second parity for the first data using an H-matrix and the first data, compare the first parity to the second parity to generate a first syndrome, and generate a decoding status flag (DSF) with different states on the basis of a number of "0" or "1" bits included in the first syndrome.

20 Claims, 10 Drawing Sheets

$$H \cdot R = \begin{pmatrix} & C1 & C2 & \cdots & C128 & C129 & C130 & \cdots & C136 \\ R1 & h11 & h12 & \cdots & h1128 & 1 & 0 & \cdots & 0 \\ R2 & h21 & h22 & \cdots & h2128 & 0 & 1 & \cdots & 0 \\ & \cdot & \cdot & \cdot & \cdot & \cdot & \cdot & \cdot & \cdot \\ & \cdot & \cdot & \cdot & \cdot & \cdot & \cdot & \cdot & \cdot \\ & \cdot & \cdot & \cdot & \cdot & \cdot & \cdot & \cdot & \cdot \\ R8 & h81 & h82 & \cdots & h8128 & 0 & 0 & \cdots & 1 \end{pmatrix} \cdot \begin{pmatrix} r1 \\ r2 \\ \cdot \\ \cdot \\ \cdot \\ r128 \\ P21 \\ P22 \\ \cdot \\ \cdot \\ P28 \end{pmatrix} = \begin{pmatrix} 0 \\ 0 \\ \cdot \\ \cdot \\ \cdot \\ 0 \end{pmatrix}$$

$$H' \cdot R' = \begin{pmatrix} & C1' & C2' & \cdots & C128' & C129' & C130' & \cdots & C136' \\ R1' & h11' & h12' & \cdots & h1128' & 1 & 0 & \cdots & 0 \\ R2' & h21' & h22' & \cdots & h2128' & 0 & 1 & \cdots & 0 \\ & \cdot & \cdot & \cdot & \cdot & \cdot & \cdot & & \cdot \\ & \cdot & \cdot & \cdot & \cdot & \cdot & \cdot & & \cdot \\ & \cdot & \cdot & \cdot & \cdot & \cdot & \cdot & & \cdot \\ R8' & h81' & h82' & \cdots & h8128' & 0 & 0 & \cdots & 1 \end{pmatrix} \cdot \begin{pmatrix} r1' \\ r2' \\ \cdot \\ \cdot \\ \cdot \\ r128' \\ P31 \\ P32 \\ \cdot \\ \cdot \\ P38 \end{pmatrix} = \begin{pmatrix} 0 \\ 0 \\ \cdot \\ \cdot \\ \cdot \\ \cdot \\ 0 \end{pmatrix}$$

$$H'' = \begin{Bmatrix} C1'' & C2'' & C3'' & C4'' & C5'' & C6'' & C7'' & C8'' \\ 0 & 1 & 1 & 0 & 0 & 1 & 1 & 1 \\ 0 & 1 & 0 & 1 & 1 & 1 & 0 & 1 \\ 1 & 0 & 1 & 1 & 1 & 0 & 0 & 1 \\ 1 & 1 & 1 & 0 & 1 & 1 & 1 & 0 \end{Bmatrix}$$

SEMICONDUCTOR MEMORY DEVICE AND MEMORY SYSTEM HAVING THE SAME

CROSS-REFERENCE TO THE RELATED APPLICATION

This application claims priority under 35 U.S.C. § 119 to Korean Patent Application No. 10-2018-0142547, filed on Nov. 19, 2018, the disclosure of which is incorporated herein by reference in its entirety.

BACKGROUND

1. Field

Devices and systems consistent with example embodiments relate to a semiconductor memory device and a memory system including the same.

2. Description of Related Art

A memory system may include a semiconductor memory device and a controller. Generally, each of the semiconductor memory device and the controller may perform a predetermined error correcting code (ECC) decoding operation. For example, the semiconductor memory device may perform a 1-bit error detection and 1-bit error correction operation, and the controller may perform only a 3-bit error detection operation or only a 1-bit error correction and 2-bit error detection operation. Accordingly, various techniques for improving such a limitation are being developed.

SUMMARY

The example embodiments of the inventive concept are directed to providing a semiconductor memory device capable of quickly generating a decoding status flag (DSF) according to a type of an error during an error correcting code (ECC) decoding operation and a memory system including the same.

According to example embodiments, there is provided a semiconductor memory device including a row decoder configured to decode a row address to generate a plurality of word line selection signals, a column decoder configured to decode a column address to generate a plurality of column selection signals, a memory cell array including a plurality of memory cells, one or more of the plurality of memory cells being selected in response to the plurality of word line selection signals and the plurality of column selection signals, and an error correcting code (ECC) decoder configured to receive first data and a first parity for the first data from the selected memory cells of the memory cell array, generate a second parity for the first data using an H-matrix and the first data, compare the first parity to the second parity to generate a first syndrome, and generate a decoding status flag (DSF) with different states on the basis of a number of bits of "0" or "1" included in the first syndrome.

According to example embodiments, there is provided a semiconductor memory device including a row decoder configured to decode a row address to generate a plurality of word line selection signals, a column decoder configured to decode a column address to generate a plurality of column selection signals, a memory cell array including a plurality of memory cells, one or more of the plurality of memory cells selected in response to the plurality of word line selection signals and the plurality of column selection signals, and an error correcting code (ECC) decoder configured to receive first data and a first parity for the first data from the selected memory cells of the memory cell array, generate a second parity for the first data using a first H-matrix and the first data, compare the first parity to the second parity to generate a first syndrome, compare two adjacent bits of the first syndrome to generate a second syndrome, and generate a decoding status flag (DSF) with different states using the second syndrome and a second H-matrix generated by performing an exclusive OR (XOR) operation on the two adjacent bits of each of the first codes.

According to example embodiments, there is provided a memory system including a semiconductor memory device and a controller. The semiconductor memory device includes a row decoder configured to decode a row address to generate a plurality of word line selection signals, a column decoder configured to decode a column address to generate a plurality of column selection signals, a memory cell array including a plurality of memory cells, one or more of the plurality of memory cells being selected in response to the plurality of word line selection signals and the plurality of column selection signals and includes a first error correcting code (ECC) decoder. The first ECC decoder is configured to receive first data and a first parity for the first data from the selected memory cells of the memory cell array, generate a second parity for the first data using a first H-matrix and the first data, compare the first parity to the second parity to generate a first syndrome, generate a decoding status flag (DSF) with different states on the basis of a type of an error of the first data indicated by the first syndrome, and generate second data based on a result from an operation of the first ECC decoder. The controller controls an operation of the semiconductor memory device. The controller includes a second ECC decoder configured to perform an ECC decoding operation selected from among a plurality of ECC decoding operations on the second data applied from the semiconductor memory device in response to the DSF applied from the semiconductor memory device.

DETAILED DESCRIPTION

Hereinafter, a semiconductor memory device and a memory system including the same according to example embodiments of the inventive concept will be described with reference to the accompanying drawings.

Figure 1:
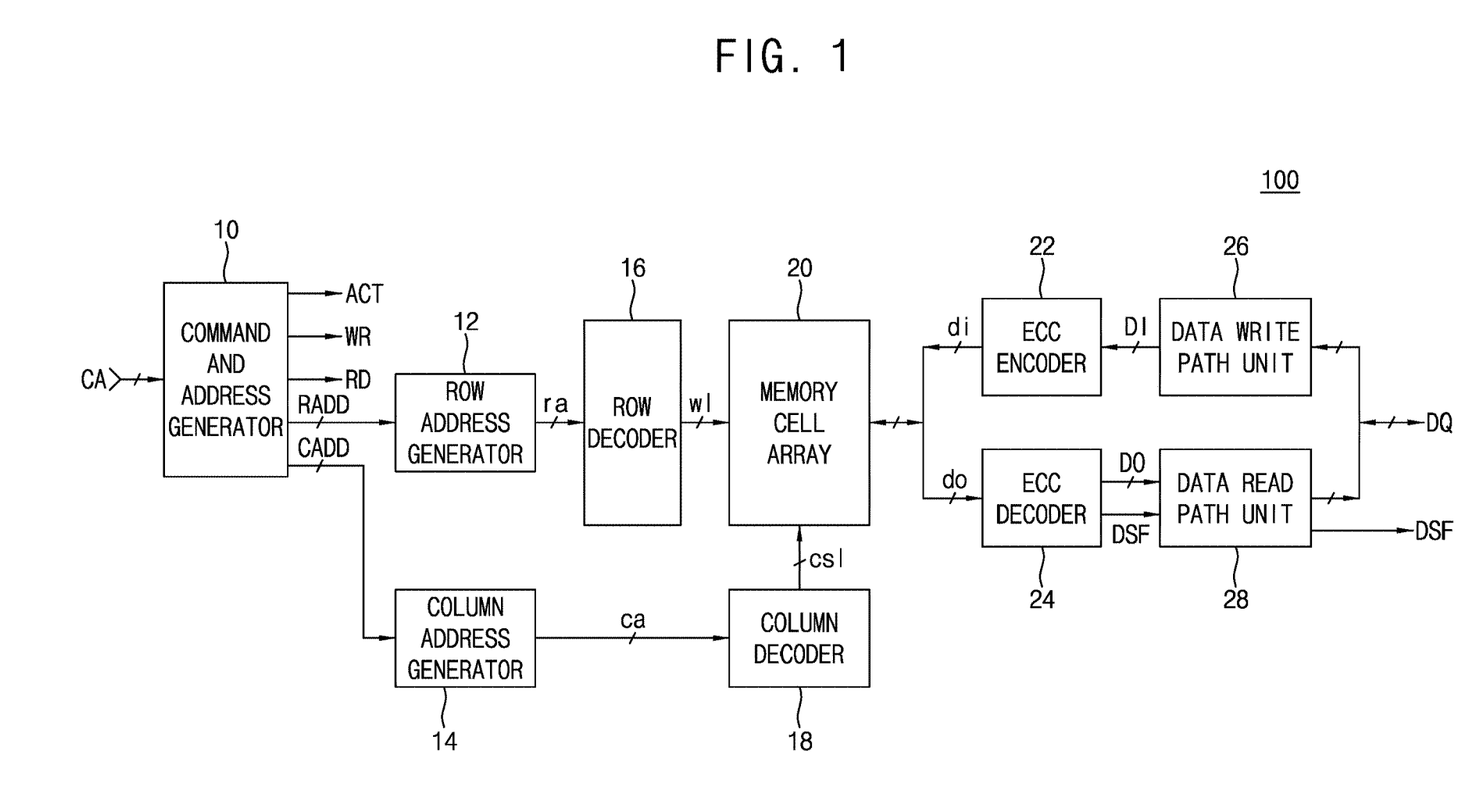
FIG. 1 is a block diagram of a semiconductor memory device according to an example embodiment of the inventive concept.

FIG. 1 is a block diagram showing a semiconductor memory device according to an example embodiment of the inventive concept. A semiconductor memory device 100 may include a command and address generator 10, a row address generator 12, a column address generator 14, a row decoder 16, a column decoder 18, a memory cell array 20, an error correcting code (ECC) encoder 22, an ECC decoder 24, a data write path unit 26, and a data read path unit 28. The semiconductor memory device 100 may be an integrated circuit embodied within a semiconductor chip. As used herein, a "unit" and a "block" may be implemented by a circuit, such as part of an integrated circuit of the semiconductor memory device 100.

A function of each of the blocks shown in FIG. 1 will be described as follows.

The command and address generator 10 may decode a command signal included in a command and address CA to generate an active command ACT, a write command WR, or a read command RD, and may generate a row address RADD or a column address CADD using an address signal included in the command and address CA. The row address RADD may be generated together with the active command ACT, and the column address CADD may be generated together with the write command WR or the read command RD.

The row address RADD may be input to the row address generator 12 to generate a row address signal ra.

The column address CADD may be input to the column address generator 14 to generate a column address signal ca.

For example, the row address RADD may include a plurality of row addresses, the column address CADD may include a plurality of column addresses, the row address signal ra may include a plurality of row address signals, and the column address signal ca may include a plurality of column address signals.

The row decoder 16 may decode the row address signal ra to generate a plurality of word line selection signals wl.

The column decoder 18 may decode the column address signal ca to generate a plurality of column selection signals csl.

The memory cell array 20 may include a plurality of memory cells (not shown). The memory cell array 20 may store data and a first parity of data di in memory cells selected by one of the plurality of word line selection signals wl and one of the plurality of column selection signals csl during a write operation in response to the write command WR and may output data and the first parity of data do from memory cells selected during a read operation in response to the read command RD. For example, the memory cell array 20 may store data di including 16n-bit data and j-bit first parity of the 16n-bit data and may output data do including 16n-bit data and j-bit first parity of the 16n-bit data. Here, each of n and j is a natural number equal to or greater than 1. In example embodiments, a number of bits of the 16n-bit data may be variable such as bits of 4n-bit, bits of 8n-bit, bits of 32n-bit, etc. The ECC encoder 22 may receive data DI to generate a first parity of the data DI, and the ECC encoder 22 may output the data DI and the first parity of the data DI as the data di. For example, the ECC encoder 22 may generate 16n-bit data and j-bit first parity of the 16n-bit data as the data di.

The ECC decoder 24 may receive data do including 16n-bit data and j-bit first parity to generate a second parity, compare the j-bit first parity included in the data do to the second parity to generate a syndrome, and generate a decoding status flag (DSF) on the basis of a type of an error using the syndrome. Here, the type of an error may be a non-error NE, a correctable error CE, or an uncorrectable error UE. As used herein, "non-error" indicates that data has no error bit. For example, the ECC decoder 24 may set the DSF to "0" when the error type is the NE or CE and set the DSF to "1" when the error type is the UE. For example, the ECC decoder 24 may generate a j-bit second parity for 16n-bit data included in the 16n-bit data and j-bit first parity of data do. The ECC decoder 24 may generate 16n-bit data of data DO and the 1-bit DSF in series or in parallel. When the error type is the CE, for example, a 1-bit error, the ECC decoder 24 may correct an error of the 16n-bit data included in the 16n-bit data and j-bit first parity of data do to generate corrected 16n-bit data of data DO and a DSF of "0."

The data write path unit 26 may sequentially receive data DQ in series and output the data DQ as data DI in parallel. For example, the data write routing unit 26 may receive n-bit data 16 times in series to generate 16n-bit data. The data write path unit 26 may receive data DQ and output the data DQ as data DI when the semiconductor memory device 100 performs a write operation.

The data read path unit 28 may receive data DO and sequentially output data in series. For example, the data read path unit 28 may receive 16n-bit data in parallel and sequentially output n-bit data 16 times in series. Also, the data read path unit 28 may transmit a 1-bit DSF in series with the n-bit data through one of data terminals (not shown) for transmitting n-bit data or in parallel with the n-bit data through a separate terminal (not shown). In other example, the data read path unit 28 may transmit at least two-bit DSF. The data read path unit 28 may receive data DO and output the data DO as the data DQ when the semiconductor memory device 100 performs a read operation.

Although not shown, when a burst length BL is set to 16, the semiconductor memory device 100 according to example embodiments of the inventive concept may sequentially receive or output n-bit data 16 times in series through n data terminals (not shown).

Figure 2:
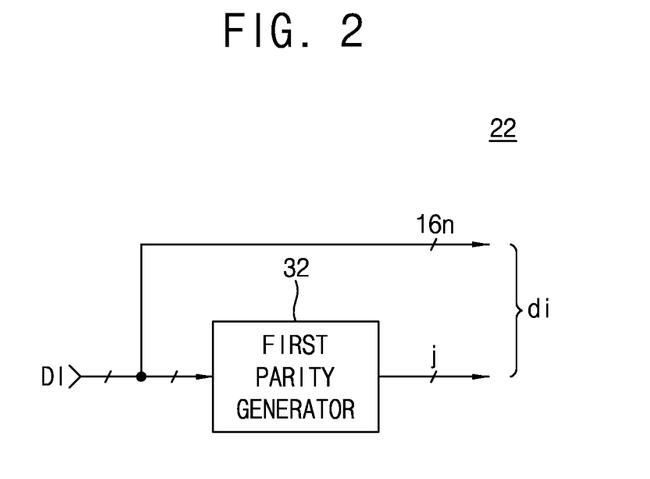
FIG. 2 is a diagram showing an error correcting code (ECC) encoder according to an example embodiment of the inventive concept.

FIG. 2 is a diagram showing the ECC encoder 22 according to an example embodiment of the inventive concept. The ECC encoder 22 may include a first parity generator 32.

Referring to FIG. 2, the first parity generator 32 may receive data DI output from the data write path unit 26 to generate the data DI and a first parity of the data DI as the data di.

Figure 3:
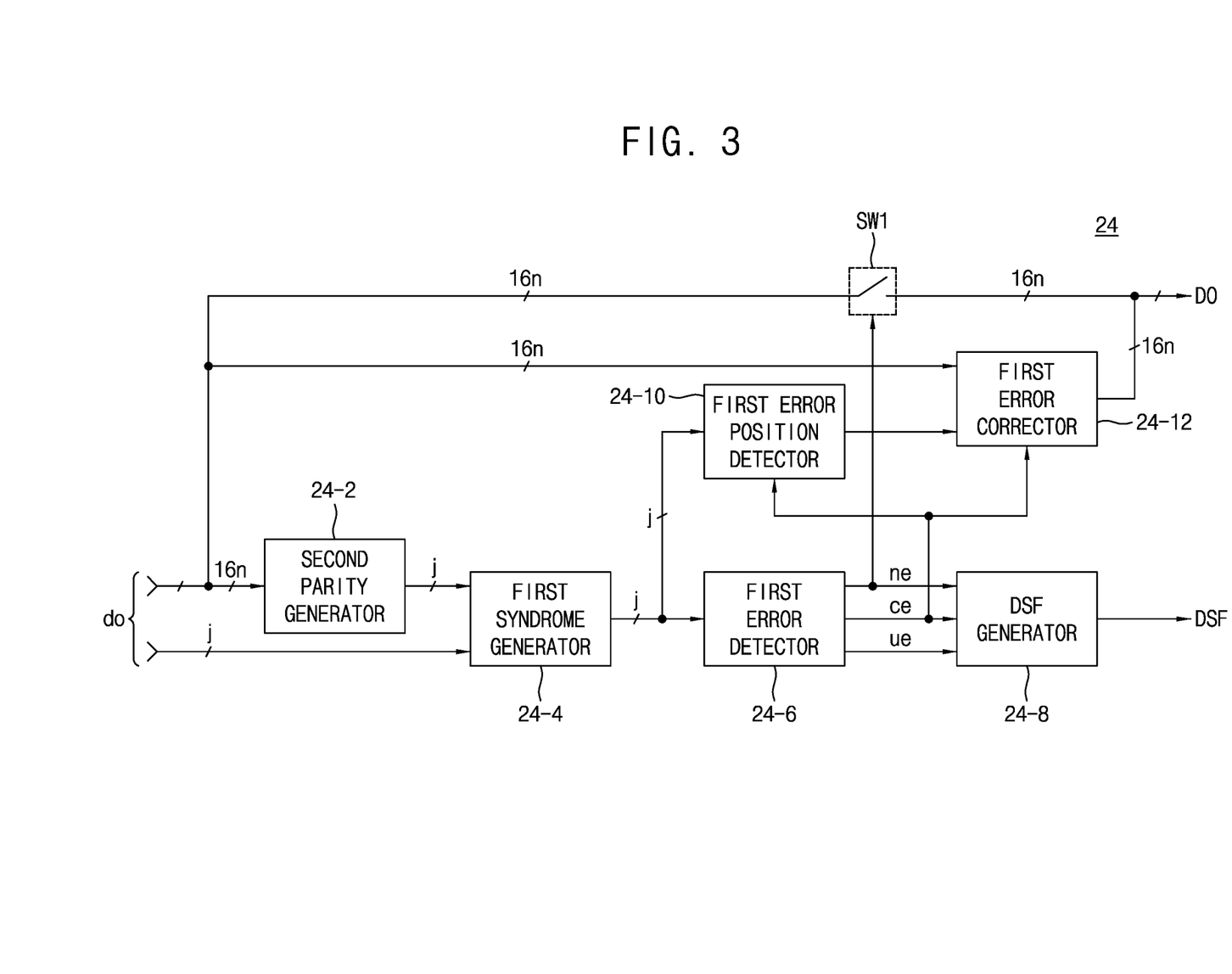
FIG. 3 is a diagram showing a configuration of an ECC decoder according to an example embodiment of the inventive concept.

FIG. 3 is a diagram showing a configuration of the ECC decoder 24 according to an example embodiment of the inventive concept. The ECC decoder 24 may include a second parity generator 24-2, a first syndrome generator 24-4, a first error detector 24-6, a DSF generator 24-8, a first error position detector 24-10, a first error corrector 24-12, and a first switch SW1.

A function of each of the blocks shown in FIG. 3 will be described as follows.

The second parity generator 24-2 may receive 16n-bit data output from the memory cell array 20 to generate a j-bit second parity for the received 16n-bit data. For example, the second parity generator 24-2 may generate the j-bit second parity using the 16n-bit data and a first H-matrix H.

Figure 4:
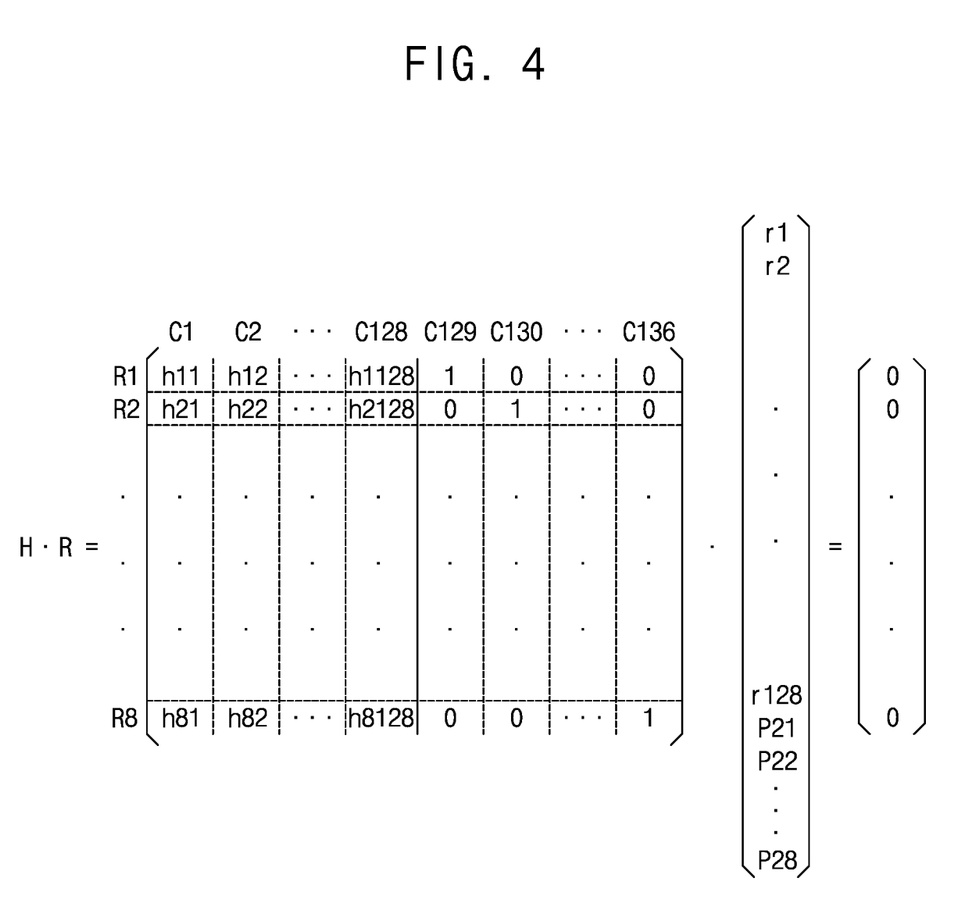
FIG. 4 is a diagram for describing a parity operation of a second parity generator according to an example embodiment of the inventive concept.
Figure 5:
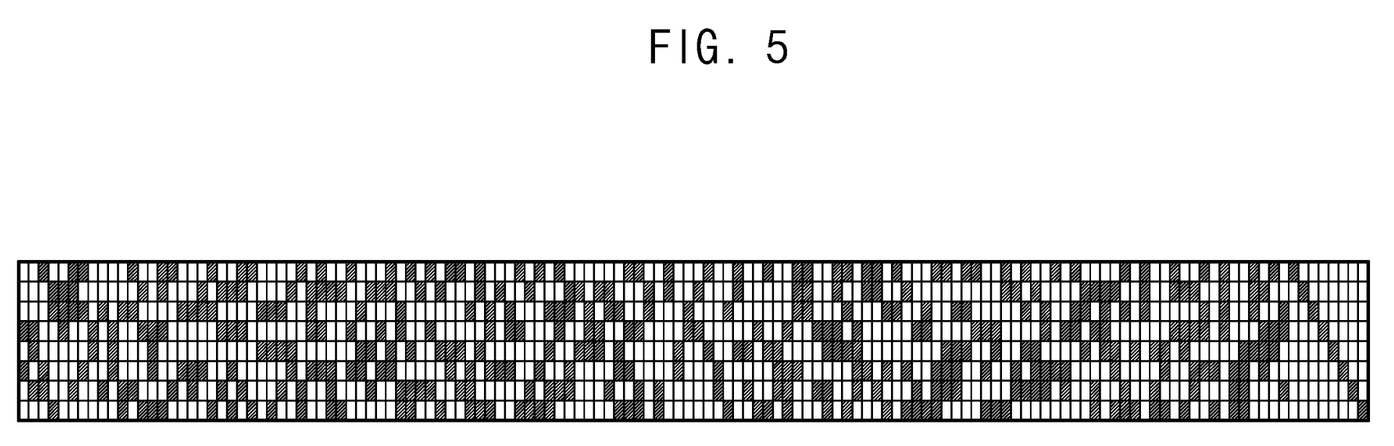
FIG. 5 is a view showing codes of a first H-matrix according to an example embodiment of the inventive concept.

FIG. 4 is a diagram illustrating a parity operation of the second parity generator 24-2 according to an example embodiment of the inventive concept and is a diagram for describing the parity operation on the assumption that n and j are 8, respectively. FIG. 5 is a view showing codes of the first H-matrix H according to an example embodiment of the inventive concept.

Referring to FIGS. 4 and 5, the first H-matrix H may be an 8×136 matrix, and a matrix R of 128-bit data and an 8-bit second parity may be a 136×1 matrix. Codes (h11 to h81, h12 to h82, . . . , and h1128 to h8128, 10 . . . 0, 01 . . . 0, . . . , and 00 . . . 1) of 136 column vectors C1 to C136 of the first H-matrix H may have different codes including bits of "0" and "1" except for a code including all "0" bits. Further, in the first H-matrix H, each of the codes (h11 to h81, h12 to h82, . . . , and h1128 to h8128, 10 . . . 0, 01 . . . 0, . . . , and 00 . . . 1) of the 136 column vectors C1 to C136 may have four "1" or fewer. For the first H-matrix H, a total of $2^{128}$ different codes including codes (h11~h1128, h21~h2128, . . . , and h81~h8128) of row vectors R1 to R8 may be generated, and the same or different 8-bit second parities may be generated for the $2^{128}$ codes in total. In this case, a minimum hamming distance dmin between any two codes of the total of $2^{128}$ different 136-bit codes in total may be three or more. In FIG. 5, white portions indicate "0," and hatched portions indicate "1." Each of the codes (h11 to h81, h12 to h82, . . . , and h1128 to h8128) of the column vectors C1 to C128 of the first H-matrix H may have two, three, or four "1", and each of the codes of the column vectors C129 to C136 of the first H-matrix H may have one "1".

Referring to FIGS. 3, 4, and 5, the second parity generator 24-2 may perform an exclusive OR (XOR) on each of the codes (h11~h1128, h21~h2128, . . . , and h81~h8128) included in the row vectors R1 to R8 of the first H-matrix H and then perform a modulo 2 operation thereon to generate 8-bit second parity P21 to P28.

For example, the 8-bit second parity P21 to P28 may be expressed using the following equation.

$$P21 = h11\char`^ r1 + h12\char`^ r2 + \ldots + h1128\char`^ r128$$
$$P22 = h21\char`^ r1 + h22\char`^ r2 + \ldots + h2128\char`^ r128$$
$$\ldots$$
$$P28 = h81\char`^ r1 + h82\char`^ r2 + \ldots + h8128\char`^ r128.$$

Here, "^" may indicate an XOR operator, and "+" may indicate a modulo 2 operator.

In this case, referring to FIG. 2, the first parity generator 32 may generate the 8-bit first parity using 128-bit data and codes of the column vectors C1 to C128 of the first H-matrix H. Although not shown, the 8-bit first parity may be expressed as P11 to P18.

Referring to FIGS. 2 to 5, the first syndrome generator 24-4 may compare the j-bit second parity to the j-bit first parity output from the memory cell array 20 to generate a j-bit first syndrome. For example, the first syndrome generator 24-4 may compare the 8-bit second parity P21 to P28 to the 8-bit first parity P11 to P18 output from the memory cell array 20 to generate an 8-bit first syndrome S1 to S8. The first syndrome generator 24-4 may perform an XOR operation on corresponding bits of the 8-bit second parity P21 to P28 and the 8-bit first parity P11 to P18 (i.e., S1=P21^P11, S2=P22^P12, . . . , S8=P28^P18) to generate the 8-bit first syndrome S1 to S8. For example, the first syndrome generator 24-4 may generate "0" when the corresponding bits of the 8-bit second parity P21 to P28 and the 8-bit first parity P11 to P18 are the same and may generate "1" when the corresponding bits of the 8-bit second parity P21 to P28 and the 8-bit first parity P11 to P18 are different from each other.

Referring to FIGS. 2 to 5, the first error detector 24-6 may generate a non-error signal ne indicating a non-error NE when the j-bit first syndrome is all "0", may determine that the j-bit first syndrome is included in the codes of the column vectors of the first H-matrix H and generate a correctable error signal ce indicating a correctable error CE when a number of "1" bits of the j-bit first syndrome is equal to or less than the maximum number of "1" bits of the codes of the column vectors of the first H-matrix H, or may determine that the j-bit first syndrome is not included in the codes of the column vectors of the first H-matrix H and generate an uncorrectable error signal ue indicating an uncorrectable error UE when the number of "1" bits of the j-bit first syndrome is greater than the maximum number of "1" bits of the codes of the column vectors of the first H-matrix H. For example, the first error detector 24-6 may generate the non-error signal ne when the 8-bit first syndrome S1 to S8 is all "0", may determine that the 8-bit first syndrome S1 to S8 is included in codes (h11 to h81, h12 to h82, . . . , and h1128 to h8128, 10 . . . 0, 01 . . . 0, . . . , and 00 . . . 1) of 136 column vectors C1 to C136 of the first H-matrix H and generate the correctable error signal ce indicating the correctable error CE as a 1-bit error when a number of "1" bits of the 8-bit first syndrome is equal to or less than four, or may determine that the 8-bit first syndrome is not included in the codes (h11 to h81, h12 to h82, . . . , and h1128 to h8128, 10 . . . 0, 01 . . . 0, . . . , and 00 . . . 1) of the 136 column vectors C1 to C136 of the first H-matrix H and generate the uncorrectable error signal ue indicating the uncorrectable error UE when the number of "1" bits of the 8-bit first syndrome S1 to S8 is greater than four, that is, is greater than or equal to five.

Figure 11:
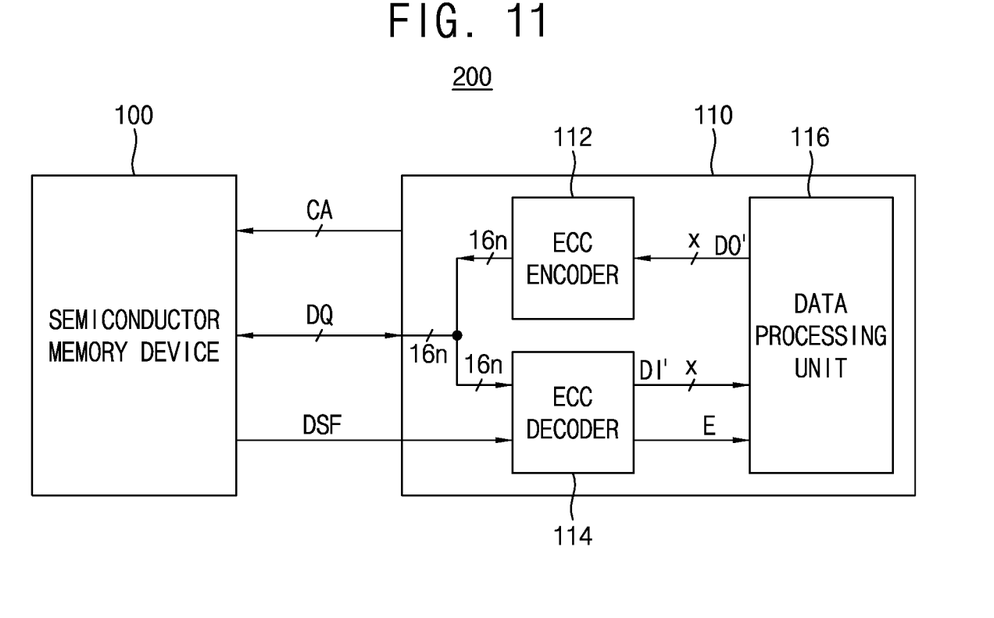
FIG. 11 is a block diagram showing a memory system according to an example embodiment of the present invention.

Referring to FIGS. 3 to 5, the DSF generator 24-8 may generate a DSF with different statuses when the non-error signal ne or the correctable error signal ce is generated and when the uncorrectable error signal ue is generated. For example, the DSF generator 24-8 may generate the DSF with a first status, for example, of "0," when the non-error signal ne or the correctable error signal ce is generated and may generate the DSF with a second status, for example, of "1," when the uncorrectable error signal ue is generated. Alternatively, the DSF generator 24-8 may generate the DSF with different statuses when the non-error signal ne is generated, when the correctable error signal ce is generated, and when the uncorrectable error signal ue is generated. The DSF generator 24-8 may output the DSF of "0," or "1" to an external device (e.g., a controller 110 as shown in FIG. 11) outside of the semiconductor memory device 100 when the semiconductor memory device 100 performs a read operation. For example, the DSF generator 24-8 may output the DSF through one of data terminals (e.g., data pads or data pins) of data DQ with data or through a separate terminal (e.g., a pad or a pin) other than the data terminals.

Referring to FIGS. 3 to 5, in response to the correctable error signal ce, the first error position detector 24-10 may determine which of the codes of the column vectors of the first H-matrix H match the j-bit first syndrome, detect an error position, and generate error position information. For example, the first error position detector 24-10 may determine which of the codes (h11 to h81, h12 to h82, ..., and h1128 to h8128) of the 128 column vectors C1 to C128 match the 8-bit first syndrome S1 to S8, detect the error position, and generate the error position information. When the code h11 to h81 of the first column code C1 of the first H-matrix H matches the 8-bit first syndrome S1 to S8, the first error position detector 24-10 may generate the error position information indicating that an error is present at the first position.

Referring to FIGS. 3 to 5, the first error corrector 24-12 may correct an error of 16n-bit data on the basis of the error position information. For example, when the error position information indicates a first position, the first error corrector 24-12 may correct the error by inverting the first bit (r1 shown in FIG. 4) of 128-bit data r1 to r128. The first error corrector 24-12 may generate the corrected 128-bit data as data DO.

Referring to FIGS. 3 to 5, the first switch SW1 may be turned on to generate the 16n-bit data as the data DO in response to the non-error signal ne (or the uncorrectable error signal ue).

Figure 6:
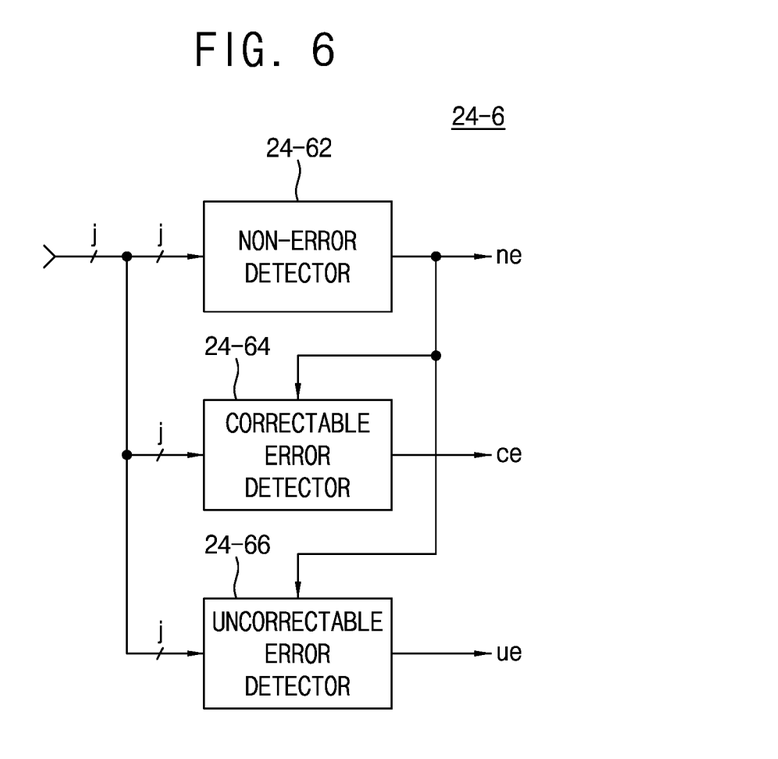
FIG. 6 is a block diagram showing a configuration of a first error detector according to an example embodiment of the inventive concept.

FIG. 6 is a block diagram showing a configuration of the first error detector 24-6 according to an example embodiment of the inventive concept. The first error detector 24-6 may include a non-error detector 24-62, a correctable error detector 24-64, and an uncorrectable error detector 24-66.

A function of each of the blocks shown in FIG. 6 will be described as follows.

The non-error detector 24-62 may receive j-bit first syndrome, and activate a non-error signal ne indicating the non-error NE when the j-bit first syndrome is all "0".

When the non-error signal ne is not activated and the number of "1" bits included in the j-bit first syndrome is less than or equal to the maximum number of "1" bits of the codes of the column vectors of the first H-matrix H, the correctable error detector 24-64 may activate the correctable signal ce. For example, the codes (h11 to h81, h12 to h82, ..., and h1128 to h8128, 10 ... 0, 01 ... 0, ..., and 00 ... 1) of the 136 column vectors C1 to C136 of the first H-matrix H shown in FIG. 4 are different codes including "0" and "1" except for a code including all "0", and each of the codes h11 to h81, h12 to h82, ..., and h1128 to h8128, 10 ... 0, 01 ... 0, ..., and 00 ... 1) of the 136 column vectors C1 to C136 have the number of "1" bits which is less than or equal to four. Thus, when the non-error signal ne is not activated and the number of "1" bits included in the 8-bit first syndrome S1 to S8 is less than or equal to four, the correctable error detector 24-64 may determine that the 8-bit first syndrome S1 to S8 corresponds to one of the codes (h11 to h81, h12 to h82, ..., and h1128 to h8128, 10 ... 0, 01 ... 0, ..., and 00 ... 1) of the 136 column vectors C1 to C136 of the first H-matrix H and generate the correctable error signal ce.

When the non-error signal ne is not activated and the number of "1" bits included in the j-bit first syndrome exceeds the maximum number of "1" bits of the codes of the column vectors of the first H-matrix H, the uncorrectable error detector 24-66 may activate the uncorrectable signal ue. For example, the codes (h11 to h81, h12 to h82, ..., and h1128 to h8128, 10 ... 0, 01 ... 0, ..., and 00 ... 1) of the 136 column vectors C1 to C136 of the first H-matrix H shown in FIG. 4 are different codes including bits of "0" and "1" except for a code including all "0" bits, and each of the codes (h11 to h81, h12 to h82, ..., and h1128 to h8128, 10 ... 0, 01 ... 0, ..., and 00 ... 1) of the 136 column vectors C1 to C136 have the number of "1" bits which is greater than four. Thus, when the non-error signal ne is not activated and the number of "1" bits included in the 8-bit first syndrome S1 to S8 exceeds four, the uncorrectable error detector 24-66 may determine that the 8-bit first syndrome S1 to S8 is not included in the codes (h11 to h81, h12 to h82, ..., and h1128 to h8128, 10 ... 0, 01 ... 0, ..., and 00 ... 1) of the 136 column vectors C1 to C136 of the first H-matrix H and generate the uncorrectable error signal ue.

The codes (h11 to h81, h12 to h82, ..., and h1128 to h8128, 10 ... 0, 01 ... 0, ..., and 00 ... 1) of the 136 column vectors C1 to C136 of the first H-matrix H may be different codes having bits of "0" and "1" except for a code having all "0" bits, and each of the codes (h11 to h81, h12 to h82, ..., and h1128 to h8128, 10 ... 0, 01 ... 0, ..., and 00 ... 1) of the 136 column vectors C1 to C136 have the number of "1" bits which is less than or equal to four. Thus, the ECC decoder 24 according to the above embodiment of the inventive concept may detect the number of "1" bits included in the 8-bit first syndrome to determine the correctable error or the uncorrectable error. Accordingly, since there is no need to compare the 8-bit first syndrome S1 to S8 to the codes (h11 to h81, h12 to h82, ..., and h1128 to h8128, 10 ... 0, 01 ... 0, ..., and 00 ... 1) of the 136 column vectors C1 to C136 of the first H-matrix H, it is possible to reduce time required for the ECC decoder 24 according to the above described embodiments of the inventive concept to determine the non-error, the correctable error, or the uncorrectable error.

Figure 7:
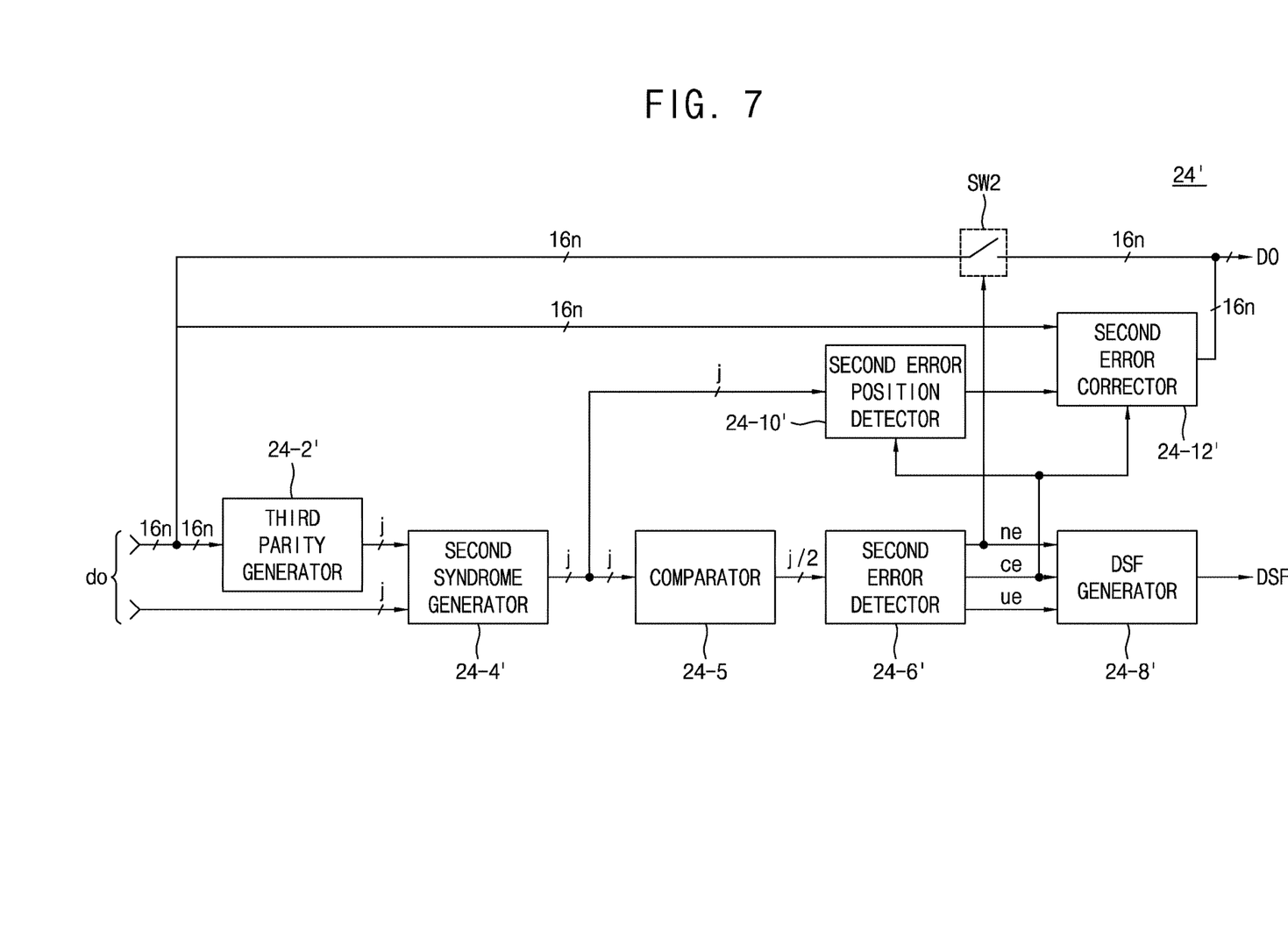
FIG. 7 is a block diagram showing an ECC decoder according to an example embodiment of the inventive concept.

FIG. 7 is a block diagram showing an ECC decoder 24' according to an example embodiment of the inventive concept. The ECC decoder 24' may include a third parity generator 24-2', a second syndrome generator 24-4', a comparator 24-5, a second error detector 24-6', a DSF generator 24-8', a second error position detector 24-10', a second error corrector 24-12', and a second switch SW2.

A function of each of the blocks shown in FIG. 7 will be described as follows.

The third parity generator 24-2' may receive 16n-bit data output from the memory cell array 20 and generate j-bit third parity for the 16n-bit data. For example, the third parity generator 24-2' may generate the j-bit third parity using the 16n-bit data and a second H-matrix H'.

Figure 8:
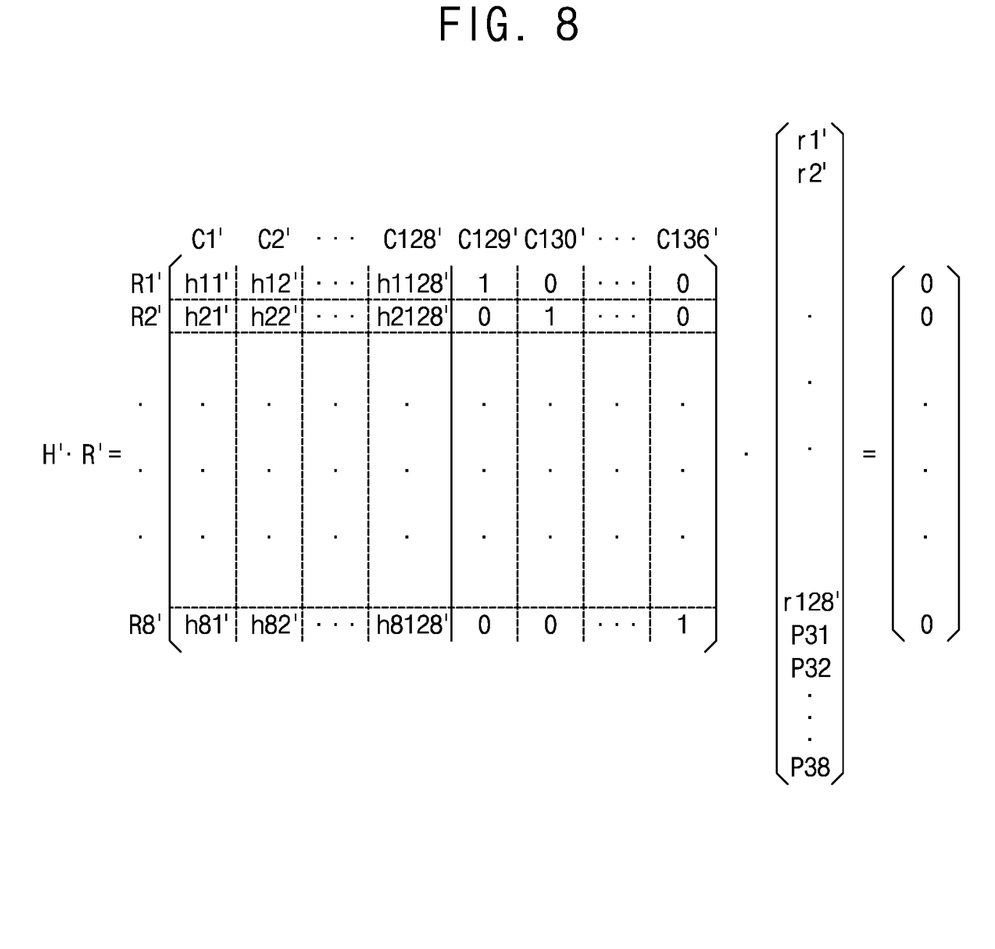
FIG. 8 is a diagram for describing a parity operation of a third parity generator according to an example embodiment of the inventive concept.
Figure 9:
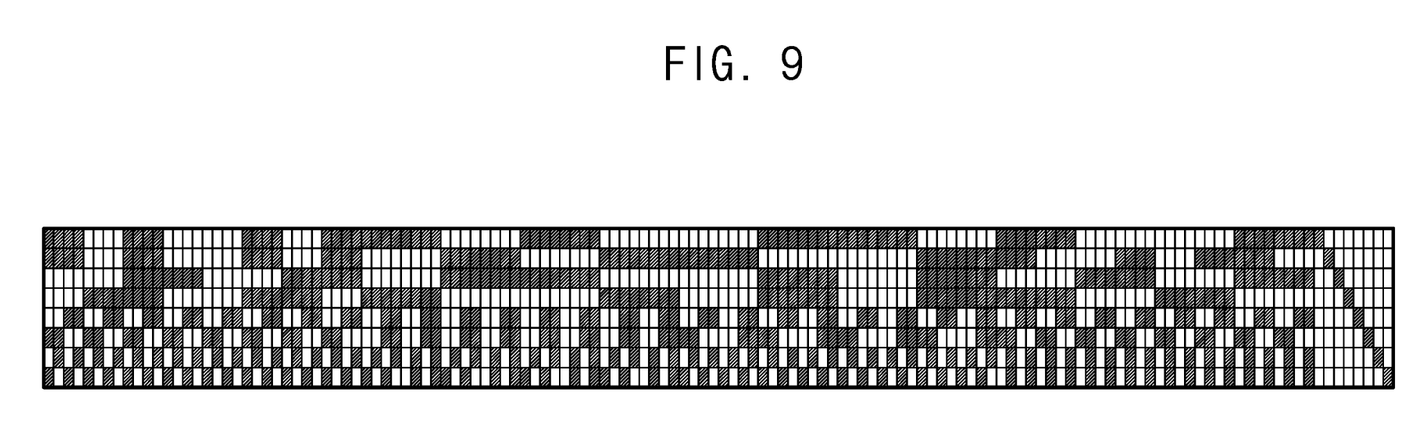
FIG. 9 is a view showing codes of a second H-matrix according to an example embodiment of the inventive concept.
Figure 10:
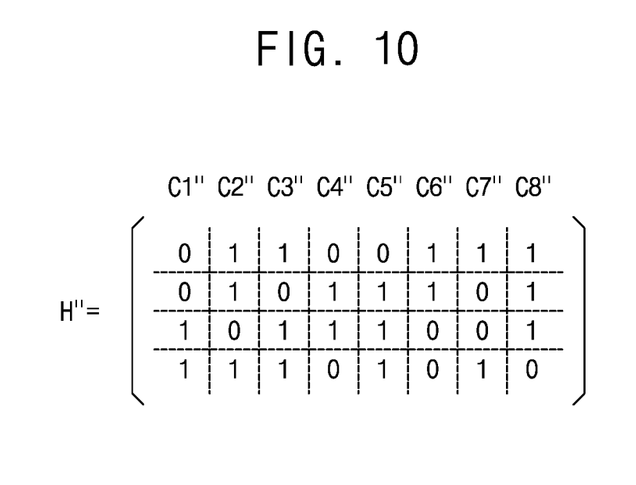
FIG. 10 is a view showing codes of a simplified second H-matrix according to an example embodiment of the inventive concept.

FIG. 8 is a diagram for describing a parity operation of the third parity generator 24-2' according to an example embodiment of the inventive concept and is a diagram for describing the parity operation on the assumption that n and j are 8, respectively. FIG. 9 is a view showing codes of the second H-matrix H' according to an example embodiment of the inventive concept, and FIG. 10 is a view showing codes of a simplified second H-matrix H" according to an example embodiment of the inventive concept.

Referring to FIGS. 8 and 9, the second H-matrix H' may be an 8×136 matrix, and a matrix R' of 128-bit data and an 8-bit third parity may be a 136×1 matrix. Codes (h11' to h81', h12' to h82', ..., and h1128' to h8128', 10 ... 0, 01 ... 0, ..., and 00 ... 1) of 136 column vectors C1' to C136' of the second H-matrix H' may be different codes including bits of "0" and "1", except for a code including all "0" bits. For the second H-matrix H', a total of $2^{128}$ different codes including codes (h11' to h1128', h21' to h2128', ..., and h81' to h8128') of row vectors R1' to R8' may be generated, and the same or different 8-bit second parities may be generated for the $2^{128}$ codes in total. In this case, a minimum hamming distance dmin between any two codes of the total of $2^{128}$ different 136-bit codes may be three. In FIG. 9, white portions indicate "0," and hatched portions indicate "1." Referring to FIGS. 9 and 10, when an XOR operation is performed between two adjacent bits of each of the codes (h11' to h81', h12' to h82', ..., and h1128' to h8128') of the 128 column vectors C1' to C128' of the second H-matrix H' shown in FIG. 9, the result may be included in one of codes of 8 column vectors C1" to C8" in the simplified second H-matrix H" shown in FIG. 9.

As an example, referring to FIG. 9, when the code h11' to h81' of the first column vector C1' of the second H-matrix H' is 11000101 and an XOR operation is performed between two adjacent bits (i.e., 1^1, 0^0, 0^1, 0^1), the code 0011 may be obtained. Referring to FIG. 10, the code 0011 is a code of the first column vector C1" of the simplified second H-matrix H". As an example, referring to FIG. 9, when the code h133' to h833' of the thirty-third column vector C33' of the second H-matrix H' is 10010001 and an XOR operation is performed between two adjacent bits (i.e., 1^0, 0^1, 0^0, 0^1), the code 1101 may be obtained. Referring to FIG. 10, the code 1101 is a code of the second column vector C2" of the simplified second H-matrix H".

Referring to FIGS. 7 to 10, the third parity generator 24-2' may perform an XOR on each of the codes (h11' to h1128', h21' to h2128', ..., and h81' to h8128') included in the row vectors R1' to R8' of the second H-matrix H' and the 128-bit data r1' to r128' of the 136×1 matrix and then perform a modulo 2 operation thereon to generate a 8-bit third parity P31 to P38.

For example, the third 8-bit parity P31 to P38 may be expressed using the following equation.

$$P31 = h11'^\wedge r1' + h12'^\wedge r2' + \ldots + h1128'^\wedge r128'$$
$$P32 = h21'^\wedge r1' + h22'^\wedge r2' + \ldots + h2128'^\wedge r128'$$
$$\ldots$$
$$P38 = h81'^\wedge r1' + h82'^\wedge r2' + \ldots + h8128'^\wedge r128'.$$

Here, "A" may indicate an XOR operator, and "+" may indicate a modulo-2 operator.

In this case, referring to FIG. 2, the first parity generator 32 may generate the 8-bit first parity P11 to P18 using the 128-bit data and the codes of the column vectors C1' to C128' of the second H-matrix H'.

Referring to FIGS. 7 to 10, the second syndrome generator 24-4' may compare the j-bit third parity to the j-bit first parity output from the memory cell array 20 to generate j-bit second syndrome. For example, the second syndrome generator 24-4' may perform an XOR operation on corresponding bits of the 8-bit third parity P31 to P38 and the 8-bit first parity P11 to P18 to generate an 8-bit second syndrome S1' to S8'. For example, the second syndrome generator 24-4' may generate "0" when the corresponding bits of the 8-bit third parity P31 to P38 and the 8-bit first parity P11 to P18 are the same and may generate "1" when the corresponding bits of the 8-bit third parity P31 to P38 and the 8-bit first parity P11 to P18 are different from each other.

Referring to FIGS. 7 to 10, the comparator 24-5 may perform an XOR operation on two adjacent bits of the j-bit second syndrome to generate a simplified j/2-bit syndrome. The comparator 24-5 may perform the XOR operation on two adjacent bits of the 8-bit syndrome S1' to S8' (S1"=S1'^S2', S2"=S3'^S4', S3"=S5'^S6', S4"=S7'^S8') to generate a simplified 4-bit syndrome S1" to S4".

Referring to FIGS. 7 to 10, the second error detector 24-6' may generate a non-error signal ne indicating a non-error NE when the j/2-bit syndrome is all "0", may generate a correctable error signal ce indicating a correctable error CE as a 1-bit error when the j/2-bit syndrome is included in the codes of the j column vectors in the simplified second H-matrix H", or may generate an uncorrectable error signal ue indicating an uncorrectable error UE when the j/2-bit syndrome is not included in the codes of the j column vectors in the simplified second H-matrix H". For example, the second error detector 24-6' may generate the non-error signal ne when the 4-bit syndrome S1" to S4" is all "0", may generate the correctable error signal ce when the 4-bit syndrome S1" to S4" is included in the codes of the eight column vectors C1" to C8" in the simplified second H-matrix H", or may generate the uncorrectable error signal ue when the 4-bit syndrome S1" to S4" is not included in the codes of the eight column vectors C1" to C8" in the simplified second H-matrix H".

Referring to FIGS. 7 to 10, the DSF generator 24-8' may perform the same function as the DSF generator 24-8 shown in FIG. 3.

Referring to FIGS. 7 to 10, in response to the correctable error signal ce, the second error position detector 24-10' may determine which of the codes of the column vectors of the second H-matrix H' match the j-bit second syndrome, detect an error position, and generate error position information. For example, when the code of the first column code C1' among the codes of the 128 column vectors C1' to C128' of the second H-matrix H' matches the 8-bit second syndrome S1' to S8', the second error position detector 24-10' may generate error position information indicating that an error is present at a first position.

Referring to FIGS. 7 to 10, the second error corrector 24-12' may correct an error of 16n-bit data on the basis of the error position information. For example, when the error position information corresponds to the first position, the second error corrector 24-12' may correct the error by inverting the first bit (r1' shown in FIG. 8) of 128-bit data r1' to r128' of the 136×1 matrix. The second error corrector 24-12' may generate the corrected 16n-bit data as the data DO.

Referring to FIGS. 7 to 10, the second switch SW2 may be turned on to generate the 16n-bit data as the data DO in response to the non-error signal ne (or the uncorrectable error signal ue).

FIG. 11 is a block diagram showing a memory system according to an example embodiment of the present invention. A memory system 200 may include a semiconductor memory device 100 and a controller 110. The controller 110 may include an ECC encoder 112, an ECC decoder 114, and a data processing unit 116.

The functions of the blocks shown in FIG. 11 may be described as follows.

The semiconductor memory device 100 may receive a command and address CA and data DQ from the controller 110 and may output the data DQ and a DSF to the controller 110. Unlike what is shown, the DSF may be transmitted before, after, or while the data DQ is transmitted not through a separate terminal but through one of data terminals (not shown) through which the data DQ is transmitted. As another example, the DSF may be transmitted through a terminal (not shown) separated from the data terminals.

The controller 110 may output the command and address CA and the data DQ to the semiconductor memory device 100 and receive the data DQ and the DSF from the semiconductor memory device 100.

The ECC encoder 112 may receive x-bit data DO' to generate a y-bit parity of the x-bit data DO' and may output 16n(=x+y)-bit data. For example, the 16n-bit data may include the x-bit data DO' and the y-bit parity.

The ECC decoder 114 may receive the data DQ and the DSF and perform a first ECC decoding operation or a second ECC decoding operation to generate data DI' and an error signal E. For example, the ECC decoder 114 may perform the first ECC decoding operation when the DSF is "0" and may perform the second ECC decoding operation when the DSF is "1." The first ECC decoding operation may be a 3-bit error detection operation, and the second ECC decoding operation may be a 1-bit error correction and 2-bit error detection operation.

In example embodiments, the ECC decoder 114 may include a first ECC decoding unit and a second ECC decoding unit (not shown). The first ECC decoding unit may receive the data DQ, and in response to the DSF of "0," perform the 3-bit error detection operation and generate x-bit data DI' and the error signal E. The second ECC decoding unit may receive the data DQ, and in response to the DSF of "1," perform the 1-bit error correction and 2-bit error detection operation and generate x-bit data DI' and the error signal E.

In example embodiments, the second ECC decoder 114 may include three or more ECC decoding units each configured to perform one of the three or more ECC decoding operations based on the DSF. In this case, a number of bits of the DSF may be 2 bits or more bits.

The data processing unit 116 may generate the x-bit data DO' and receive the x-bit data DI' and the error signal E to perform a data processing operation on the x-bit data DI'.

In the above described embodiments, although the DSF is described as being generated based on the number of "1" bits, the DSF may be generated based on the number of "0" bits.

Figure 12:
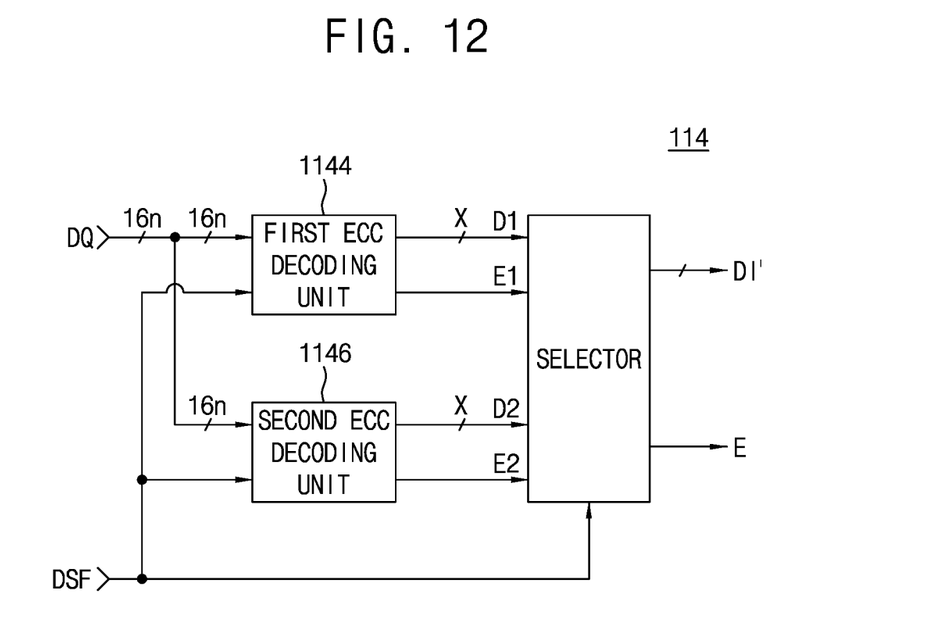
FIG. 12 is a block diagram showing a configuration of an ECC decoder of FIG. 11 according to an example embodiment of the inventive concept.

FIG. 12 is a block diagram showing a configuration of an ECC decoder of FIG. 11 according to an example embodiment of the inventive concept.

Referring to FIG. 12, the ECC decoder 114 may include a first ECC decoding unit 1144, a second ECC decoding unit 1146, and a selector 114-8.

A function of each of the blocks shown in FIG. 12 will be described as follows.

The first ECC decoding unit 1144 may receive the 16n-bit data of data DQ in response to the DSF, perform a 3-bit error detection operation, and generate x-bit first data D1 and a first error signal E1.

The second ECC decoding unit 1146 may receive the 16n-bit data of data DQ in response to the DSF, perform a 1-bit error correction and 2-bit error detection operation, and generate x-bit second data D2 and a second error signal E2.

In example embodiments, the ECC decoder 114 may perform either a first ECC decoding operation by the first ECC decoding unit 1144 or a second ECC decoding operation by the second ECC decoding unit 1146 in response to the DSF. For example, the first ECC decoding unit 1144 may perform the first ECC decoding operation in response to the DSF of "0," and the second ECC decoding unit 1146 may perform the second ECC decoding operation in response to the DSF of "1." The selector 114-8 may select either the x-bit first data D1 and the first error signal E1 or the x-bit second data D2 and the second error signal E2 in response to the DSF, and output the x-bit first data D1 and the first error signal E1 or the x-bit second data D2 and the second error signal E2 as the x-bit data DI' and the error signal E. For example, the selector 114-8 may select and transmit the x-bit first data D1 and the first error signal E1 when the DSF is "0" and select and transmit the x-bit second data D2 and the second error signal E2 when the DSF is "1."

In example embodiments, the ECC decoder 114 may include three or more ECC decoding units each configured to perform one of the three or more ECC decoding operations based on the DSF. In this case, a number of bits of the DSF may be 2 bits or more bits.

According to the above described example embodiments of the inventive concept, the semiconductor memory device is capable of quickly generating a decoding status flag according to the type of the error. Accordingly, it is possible for a memory system to selectively and efficiently perform an ECC decoding operation according to the decoding status flag.

Embodiments of the technical spirit of the inventive concept have been described above with reference to the accompanying drawings. However, it will be understood by those skilled in the art that various changes in form and details may be made therein without departing from the spirit and scope of the invention as defined by the appended claims. Therefore, the above embodiments are to be regarded as illustrative rather than restrictive.

What is claimed is:

1. A semiconductor memory device comprising:
a row decoder configured to decode a row address to generate a plurality of word line selection signals;
a column decoder configured to decode a column address to generate a plurality of column selection signals;
a memory cell array comprising a plurality of memory cells, one or more of the plurality memory cells being selected in response to the a plurality of word line selection signals and the a plurality of column selection signals; and
an error correcting code (ECC) decoder configured to:
receive first data and a first parity for the first data from the selected memory cells of the memory cell array,
generate a second parity for the first data using an H-matrix and the first data,
compare the first parity to the second parity to generate a first syndrome, and
generate a decoding status flag (DSF) with different states on the basis of the number of "0" or "1" included in the first syndrome.

2. The semiconductor memory device of claim 1, wherein codes of column vectors of the H-matrix are different codes from each other, and
wherein each of the codes includes bits of "0" and "1" except for a code of including all "0" bits.

3. The semiconductor memory device of claim 2, wherein a minimum hamming distance between the codes of the H-matrix is greater than or equal to three.

4. The semiconductor memory device of claim 2, wherein the ECC decoder is configured to:
activate a non-error signal in response to the first syndrome having all bits of "0,"
activate a correctable error signal in response to the first syndrome having a number of "1" bits less than or equal to a predetermined number, and
activate an uncorrectable error signal in response to the first syndrome having a number of "1" bits greater than the predetermined number.

5. The semiconductor memory device of claim 4, wherein the ECC decoder comprises a parity generator configured to perform an exclusive OR (XOR) operation on each of codes of row vectors of the H-matrix and the first data and a modulo 2 operation thereon to generate the second parity.

6. The semiconductor memory device of claim 5, wherein the ECC decoder further comprises:
   a syndrome generator configured to perform an XOR operation on the first parity and the second parity to generate the first syndrome; and
   an error detector configured to activate the non-error signal, the correctable error signal, or the uncorrectable error signal in response to the first syndrome.

7. The semiconductor memory device of claim 6, wherein the ECC decoder further comprises:
   an error position detector configured to detect which of the codes of the column vectors of the H-matrix match the first syndrome to generate error position information in response to the activating of the correctable error signal;
   an error corrector configured to correct an error of a corresponding position of the first data on the basis of the error position information in response to the activating of the correctable error signal; and
   a DSF generator configured to generate the DSF with different states in response to either the activating of the non-error signal or the correctable error signal or the activating of the uncorrectable error signal.

8. A semiconductor memory device comprising:
   a row decoder configured to decode a row address to generate a plurality of word line selection signals;
   a column decoder configured to decode a column address to generate a plurality of column selection signals;
   a memory cell array including a plurality of memory cells, one or more of the plurality of memory cells being selected in response to the plurality of word line selection signals and the plurality of column selection signals; and
   an error correcting code (ECC) decoder configured to:
   receive first data and a first parity for the first data output from the selected memory cells of the memory cell array,
   generate a second parity for the first data using a first H-matrix and the first data,
   compare the first parity to the second parity to generate a first syndrome,
   compare two adjacent bits of the first syndrome to generate a second syndrome, and
   generate a decoding status flag (DSF) with different states using the second syndrome and a second H-matrix,
   wherein first codes of column vectors of the first H-matrix are included in second codes of column vectors of the second H-matrix, which is generated by performing an exclusive OR (XOR) operation on the two adjacent bits of each of the first codes.

9. The semiconductor memory device of claim 8, wherein the first codes are different codes from each other, and each of the first codes includes bits of "0" and "1" except for a code including all "0" bits.

10. The semiconductor memory device of claim 9, wherein a minimum hamming distance between the first codes is greater than or equal to three.

11. The semiconductor memory device of claim 9, wherein the ECC decoder is configured to:
   activate a non-error signal in response to the second syndrome having all bits of "0,"
   activate a correctable error signal in response to the second syndrome being present in the second codes, and
   activate an uncorrectable error signal in response to the second syndrome not being present in the second codes.

12. The semiconductor memory device of claim 11, wherein the ECC decoder comprises a first parity generator configured to perform an XOR operation on each of codes of row vectors of the first H-matrix and the first data and a modulo 2 operation thereon to generate the second parity.

13. The semiconductor memory device of claim 12, wherein the ECC decoder further comprises:
   a syndrome generator configured to perform an XOR operation on the first parity and the second parity to generate the first syndrome;
   a comparator configured to perform an XOR operation on two adjacent bits of the first syndrome to generate the second syndrome; and
   an error detector configured to activate the non-error signal, the correctable error signal, and the uncorrectable error signal in response to the second syndrome.

14. The semiconductor memory device of claim 13, wherein the ECC decoder further comprises:
   an error position detector configured to detect which of the first codes match the first syndrome to generate error position information in response to the activating of the correctable error signal;
   an error corrector configured to correct an error of a corresponding position of the first data on the basis of the error position information in response to the activating of the correctable error signal; and
   a DSF generator configured to generate the DSF with different states in response to either the activating of the non-error signal or the correctable error signal or the activating of the uncorrectable error signal.

15. A memory system comprising:
   a semiconductor memory device comprising:
      a row decoder configured to decode a row address to generate a plurality of word line selection signals;
      a column decoder configured to decode a column address to generate a plurality of column selection signals;
      a memory cell array including a plurality of memory cells, one or more of the plurality of memory cells being selected in response to the plurality of word line selection signals and the plurality of column selection signals; and
      a first error correcting code (ECC) decoder configured to:
      receive first data and a first parity for the first data from the selected memory cells of the memory cell array,
      generate a second parity for the first data using a first H-matrix and the first data,
      compare the first parity to the second parity to generate a first syndrome,
      generate a decoding status flag (DSF) with different states on the basis of a type of an error of the first data indicated by the first syndrome, and
      generate second data based on a result from an operation of the first ECC decoder; and
   a controller configured to control an operation of the semiconductor memory device, the controller comprising:
      a second ECC decoder configured to perform an ECC decoding operation selected from among a plurality of ECC decoding operations on the second data applied from the semiconductor memory device in response to the DSF applied from the semiconductor memory device.

16. The memory system of claim 15, wherein first codes of column vectors of the first H-matrix are different codes from each other, and
wherein each of the first codes includes bits of "0" and "1" except for a code including all "0" bits, a minimum hamming distance between the first codes being greater than or equal to three.

17. The memory system of claim 16, wherein the first ECC decoder further comprises:
a parity generator configured to generate the second parity for the first data;
a syndrome generator configured to perform an XOR operation on the first parity and the second parity to generate the first syndrome; and
an error detector configured to:
activate a non-error signal in response to the first syndrome having all bits of "0,"
activate a correctable error signal in response to the first syndrome having a number of "1" bits less than or equal to a predetermined number, and
activate an uncorrectable error signal in response to the first syndrome having a number of "1" bits greater than the predetermined number.

18. The memory system of claim 17, wherein the first ECC decoder further comprises:
an error position detector configured to detect which of the first codes match the first syndrome to generate error position information in response to the activating of the correctable error signal;
an error corrector configured to correct an error of a corresponding position of the first data on the basis of the error position information in response to the activating of the correctable error signal; and
a DSF generator configured to generate the DSF with different states in response to either the activating of the non-error signal or the correctable error signal or the activating of the uncorrectable error signal.

19. The memory system of claim 15,
wherein the first ECC decoder is configured to compare two adjacent bits of the first syndrome to generate a second syndrome,
wherein first codes of column vectors of the first H-matrix are different codes from each other,
each of the first codes includes bits of "0" and "1" except for a code including all "0" bits, and is included in second codes of column vectors of a second H-matrix generated by performing an XOR operation on two adjacent bits of each of the first codes, a minimum hamming distance between the first codes being greater than or equal to three.

20. The memory system of claim 19, wherein the first ECC decoder comprises:
a parity generator configured to generate the second parity for the first data;
a syndrome generator configured to perform an XOR operation on the first parity and the second parity to generate a first syndrome;
a comparator configured to perform an XOR operation on two adjacent bits of the first syndrome to generate a second syndrome;
an error detector configured to:
activate a non-error signal in response to the second syndrome having all bits of "0,"
activate a correctable error signal in response to the second syndrome being present in the second codes, and
activate an uncorrectable error signal in response to the second syndrome not being present in the second codes;
an error position detector configured to detect which of the first codes match the first syndrome to generate error position information in response to the activating of the correctable error signal;
an error corrector configured to correct an error of a corresponding position of the first data on the basis of the error position information in response to the activating of the correctable error signal; and
a DSF generator configured to generate the DSF with different states in response to either the activating of the non-error signal or the correctable error signal or the activating of the uncorrectable error signal.

* * * * *